(12) United States Patent
Avoyan et al.

(10) Patent No.: US 8,075,701 B2
(45) Date of Patent: Dec. 13, 2011

(54) PROCESSES FOR RECONDITIONING MULTI-COMPONENT ELECTRODES

(75) Inventors: Armen Avoyan, Glendale, CA (US); Yan Fang, Fremont, CA (US); Duane Outka, Fremont, CA (US); Hong Shih, Walnut, CA (US); Stephen Whitten, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 701 days.

(21) Appl. No.: 12/164,294

(22) Filed: Jun. 30, 2008

(65) Prior Publication Data

US 2009/0325320 A1    Dec. 31, 2009

(51) Int. Cl.
*C23G 1/00* (2006.01)
*B08B 3/00* (2006.01)
*H01L 21/00* (2006.01)

(52) U.S. Cl. .................. 134/26; 134/2; 134/3; 438/4

(58) Field of Classification Search .............. 216/88–92; 134/2, 3, 26; 438/4
See application file for complete search history.

(56) References Cited

U.S. PATENT DOCUMENTS

| | | | | |
|---|---|---|---|---|
| 5,225,034 | A * | 7/1993 | Yu et al. .......................... | 438/693 |
| 5,355,048 | A * | 10/1994 | Estes .............................. | 310/334 |
| 6,073,577 | A | 6/2000 | Lilleland et al. | |
| 6,148,765 | A | 11/2000 | Lilleland et al. | |
| 6,194,322 | B1 | 2/2001 | Lilleland et al. | |
| 6,245,192 | B1 | 6/2001 | Dhindsa et al. | |
| 6,376,385 | B2 | 4/2002 | Lilleland et al. | |
| 6,506,254 | B1 | 1/2003 | Bosch et al. | |
| 6,776,873 | B1 * | 8/2004 | Sun et al. .................. | 156/345.41 |
| 6,810,887 | B2 * | 11/2004 | Tan ................................. | 134/1.3 |
| 7,247,579 | B2 | 7/2007 | Ren et al. | |
| 2003/0104703 | A1 | 6/2003 | Yang et al. | |
| 2003/0190870 | A1 * | 10/2003 | Shih et al. ....................... | 451/39 |
| 2005/0133160 | A1 * | 6/2005 | Kennedy et al. .......... | 156/345.34 |

(Continued)

FOREIGN PATENT DOCUMENTS

JP    7066180 A    3/1995

(Continued)

OTHER PUBLICATIONS

International Search Report and Written Opinion dated Feb. 11, 2010 pertaining to International application No. PCT/US2009/048244.

*Primary Examiner* — Michael Kornakov
*Assistant Examiner* — Nicole Blan
(74) *Attorney, Agent, or Firm* — Dinsmore & Shohl LLP

(57) ABSTRACT

A process for reconditioning a multi-component electrode comprising a silicon electrode bonded to an electrically conductive backing plate is provided. The process comprises: (i) removing metal ions from the multi-component electrode by soaking the multi-component electrode in a substantially alcohol-free DSP solution comprising sulfuric acid, hydrogen peroxide, and water and rinsing the multi-component electrode with de-ionized water; (ii) polishing one or more surfaces of the multi-component electrode following removal of metal ions there from; and (iii) removing contaminants from silicon surfaces of the multi-component electrode by treating the polished multi-component electrode with a mixed acid solution comprising hydrofluoric acid, nitric acid, acetic acid, and water and by rinsing the treated multi-component electrode with de-ionized water. Additional embodiments of broader and narrower scope are contemplated.

20 Claims, 12 Drawing Sheets

U.S. PATENT DOCUMENTS

| | | |
|---|---|---|
| 2005/0241765 A1 | 11/2005 | Dhindsa et al. |
| 2006/0046379 A1* | 3/2006 | Symanczyk et al. .......... 438/238 |
| 2006/0138081 A1 | 6/2006 | Huang et al. |
| 2006/0141787 A1 | 6/2006 | Ren et al. |
| 2006/0141802 A1* | 6/2006 | Shih et al. .................... 438/753 |
| 2007/0059645 A1* | 3/2007 | Tang et al. .................... 430/311 |
| 2007/0068629 A1 | 3/2007 | Shih et al. |
| 2007/0235660 A1 | 10/2007 | Hudson |
| 2007/0284246 A1 | 12/2007 | Keil et al. |
| 2008/0015132 A1 | 1/2008 | Ren et al. |
| 2008/0092920 A1 | 4/2008 | Shih et al. |
| 2008/0099054 A1* | 5/2008 | Rabinovich et al. ............ 134/21 |
| 2008/0236618 A1 | 10/2008 | Outka et al. |
| 2008/0236620 A1 | 10/2008 | Shih et al. |
| 2010/0108093 A1 | 5/2010 | Peng et al. |
| 2010/0139692 A1 | 6/2010 | Avoyan et al. |

FOREIGN PATENT DOCUMENTS

| | | |
|---|---|---|
| JP | 2001176846 A | 6/2001 |

* cited by examiner

PROCESSES FOR RECONDITIONING MULTI-COMPONENT ELECTRODES

SUMMARY

The present disclosure relates generally to processes for electrode reconditioning and, more particularly, to processes for reconditioning multi-component electrodes that have been used as excitation electrodes in plasma processing systems. Although the processes of the present disclosure are not limited to the context in which the electrodes have been used prior to reconditioning or particular electrode configurations, for the purposes of illustration, the process steps are illustrated herein with reference to silicon-based electrode assemblies where a silicon electrode is bonded to a backing plate. Those practicing the present invention will find that some of the process steps set forth herein enjoy favorable utility in the context of inner and outer aluminum-backed silicon electrodes.

FIG. 1 illustrates an electrode assembly 10 comprising an inner showerhead electrode 20 and an outer ring-shaped electrode 30. FIG. 2 illustrates the inner multi-component electrode 20 in isolation. FIG. 3 illustrates the outer multi-component electrode 30 in isolation. Although the respective configurations of the inner and outer electrodes 20, 30 are substantially different, the processes of the present disclosure enjoy utility in reconditioning both types of electrodes. Accordingly, it follows that the processes of the present disclosure will also enjoy utility in reconditioning other types of electrodes, including those that are structurally similar to the inner and outer electrodes and those that are structurally distinct from the inner and outer electrodes.

In accordance with one embodiment of the present disclosure, a process for reconditioning a multi-component electrode comprising a silicon electrode bonded to an electrically conductive backing plate is provided. The process comprises: (i) removing metal ions from the multi-component electrode by soaking the multi-component electrode in a substantially alcohol-free DSP solution comprising sulfuric acid, hydrogen peroxide, and water and rinsing the multi-component electrode with de-ionized water; (ii) polishing one or more surfaces of the multi-component electrode following removal of metal ions there from; and (iii) removing contaminants from silicon surfaces of the multi-component electrode by treating the polished multi-component electrode with a mixed acid solution comprising hydrofluoric acid, nitric acid, acetic acid, and water and by rinsing the treated multi-component electrode with de-ionized water. Additional embodiments of broader and narrower scope are contemplated.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
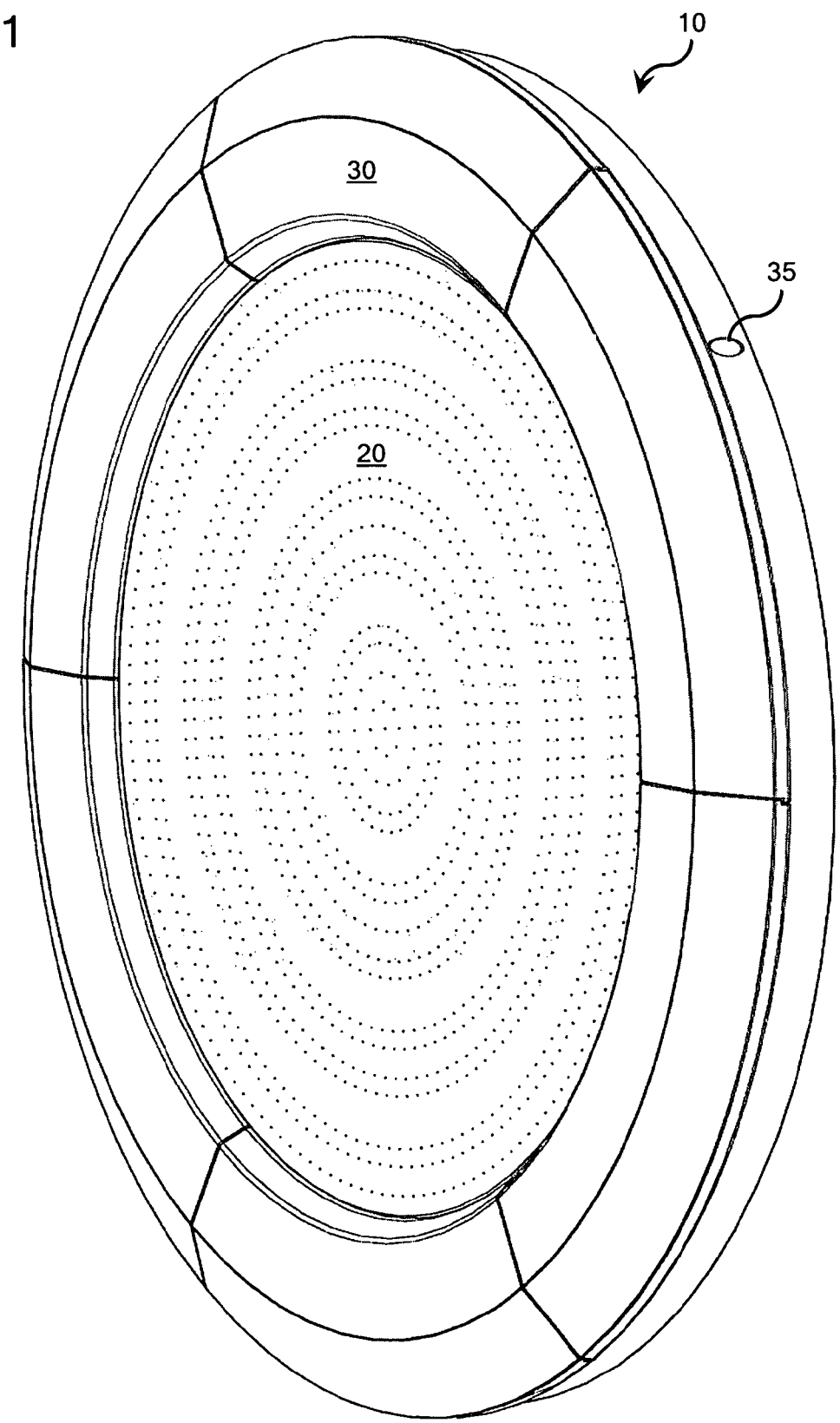
FIG. 1 illustrates an electrode assembly comprising an inner showerhead electrode and an outer ring-shaped electrode.
Figure 2:
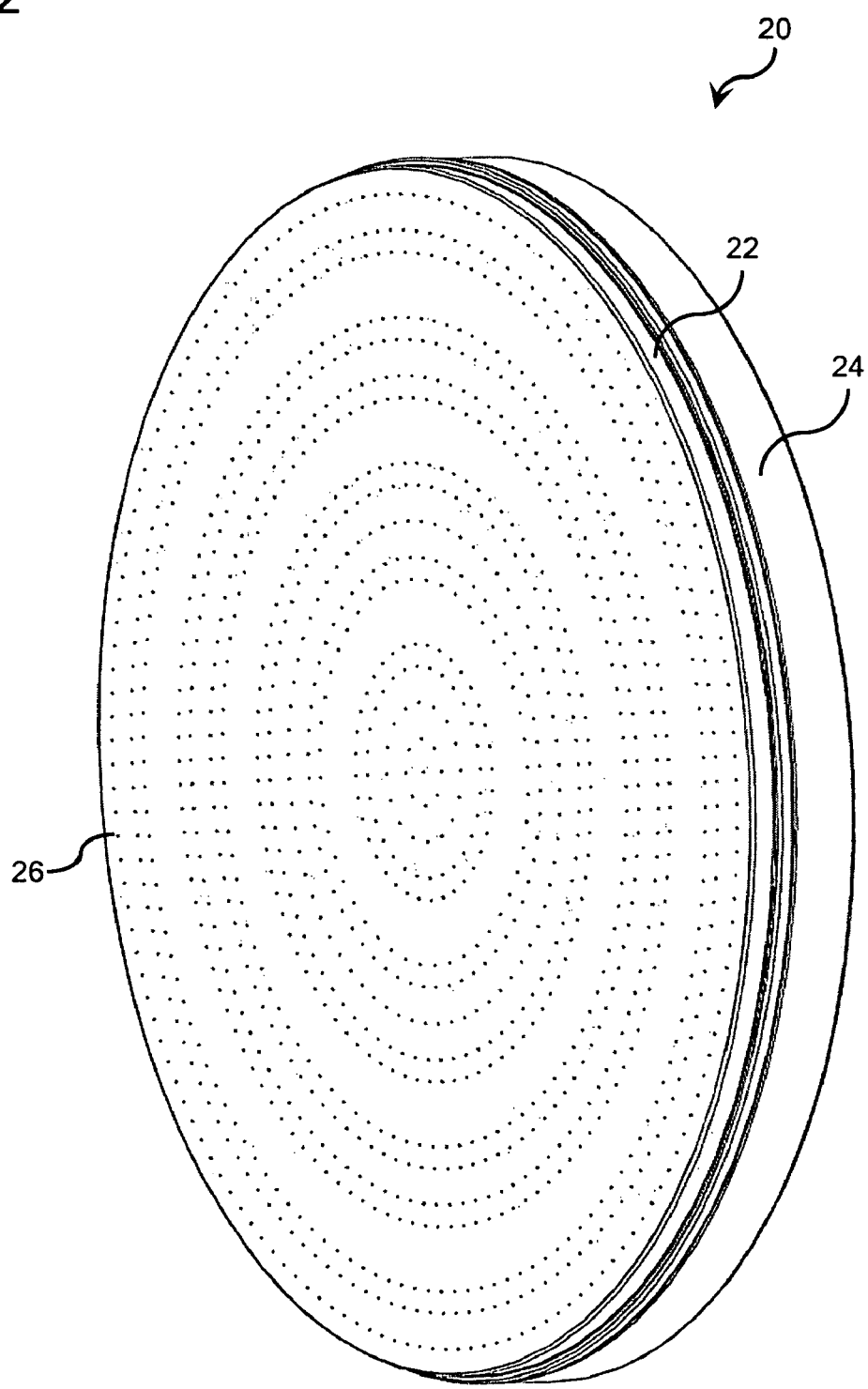
FIG. 2 illustrates the inner electrode of FIG. 1 in isolation.
Figure 3:
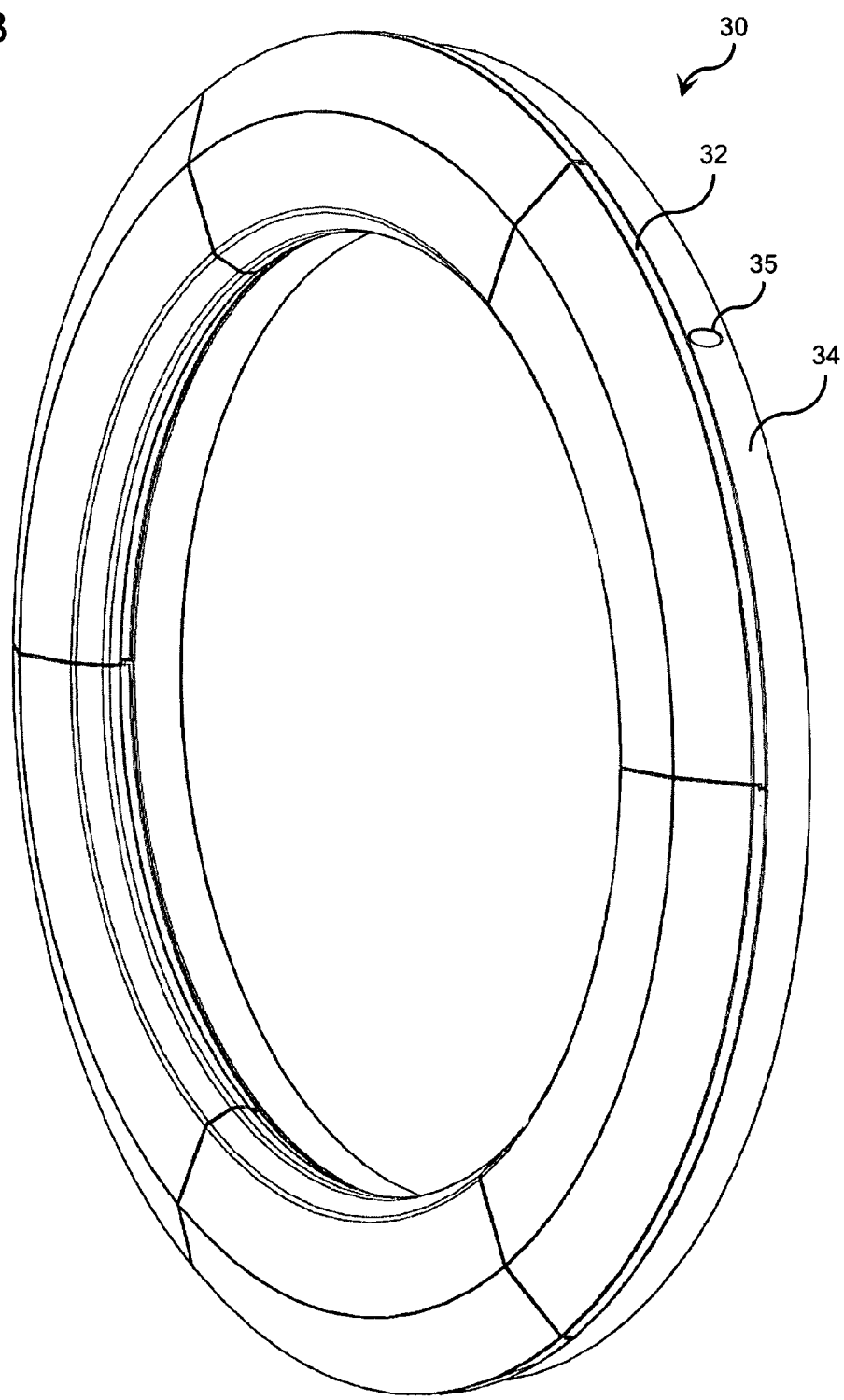
FIG. 3 illustrates the outer electrode of FIG. 1 in isolation.

As is noted above, the present disclosure relates to processes for reconditioning multi-component electrodes. FIGS. 1-3 illustrate one example of an electrode assembly 10 formed from two types of multi-component electrodes—a disc-shaped, inner multi-component electrode 20 and a ring-shaped, outer multi-component electrode 30. Both of these multi-component electrodes 20, 30 comprise a silicon electrode 22, 32 bonded to an electrically conductive backing plate 24, 34. The inner electrode illustrated in FIG. 1 and comprises an array of gas passages 26 commonly referred to in the art as showerhead passages. The outer electrode 30 comprises a series of peripheral silicon segments pieced together to surround the periphery of the inner electrode 20. Other particular features of the electrodes 20, 30 and the electrode assembly 10 are beyond the focus of the present disclosure and, as such, are not described in detail herein. Further teachings regarding the structure of electrode assemblies similar to that illustrated in FIG. 3 can be found in US Pub. Nos. 2007/0068629, 2007/0235660, and 2007/0284246, pertinent portions of which are incorporated herein by reference. Additional related teachings can be found in U.S. Pat. Nos. 6,073,577, 6,148,765, 6,194,322, 6,245,192, 6,376,385, and 6,506,254, and US Pub. No. 2005/0241765. As is noted above, the present disclosure relates generally to processes for reconditioning multi-component electrodes. The concepts of the present disclosure should not be limited to particular electrode or electrode assembly configurations.

The multi-component, inner and outer electrodes 20, 30 illustrated in FIGS. 1-3 may comprise any of a variety of backing plate configurations including, but not limited to, electrically conductive aluminum-based or graphite-based backing plates 24, 34. The silicon electrodes 22, 32 may be bonded to the corresponding electrically conductive backing plate 24, 34 in any of a variety of manners. Typically, a polymeric adhesive is applied at the interface between the electrode and backing plate and mechanical means are used to secure the bond. It is also contemplated that a non-adhesive gasket may be used at the interface and the electrode and backing plate may be bonded mechanically. With regard to the silicon electrodes 22, 32, it is noted that reference herein to a silicon electrode or an electrode comprising silicon should be read to cover any of a variety of electrodes that utilize any of a variety of forms of silicon in their construction.

Figure 4:
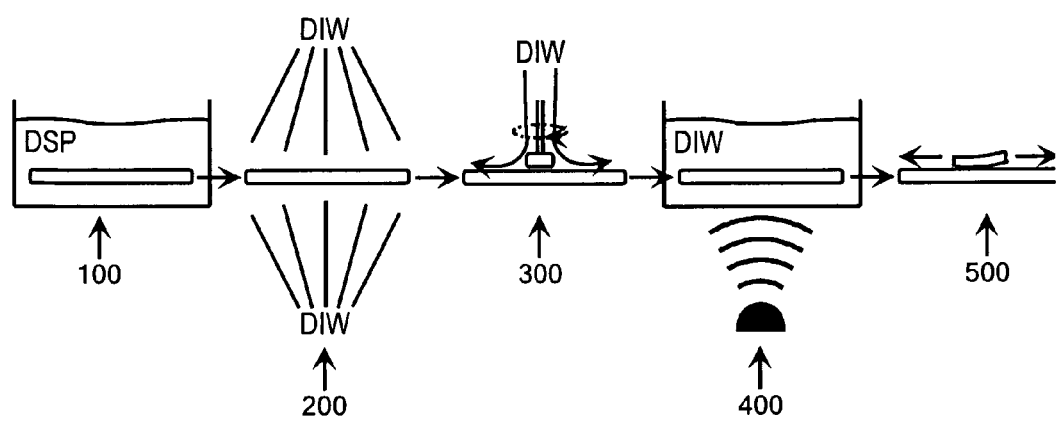
FIG. 4 illustrates a process for reconditioning a multi-component electrode.

Although the particular process steps practiced according to the present disclosure may vary, one process for reconditioning a multi-component electrode according to the present disclosure is illustrated in FIG. 4. Initially, metal ions are removed from the multi-component electrode by soaking the multi-component electrode in a substantially alcohol-free DSP solution comprising sulfuric acid, hydrogen peroxide, and water (see step 100). The DSP solution is well-suited for this step because it provides for effective ion removal and is not as likely as isopropyl alcohol or other alcohol-containing solutions to stain the electrode materials. The DSP solution is described herein as being "substantially" alcohol free because it is contemplated that trace amounts of alcohol may be present in the solution without effecting the non-staining properties of the solution. The multi-component electrode may be pre-treated by flowing $CO_2$ pellets against or across surfaces of the multi-component electrode—typically at pressures not exceeding 40 psi.

In one embodiment, the DSP solution comprises a majority of water, and more hydrogen peroxide than sulfuric acid, by volume. More specifically, the DSP solution may comprise at least approximately 80% water, by volume. It is further contemplated that the DSP solution may comprise approximately 70-90% water, approximately 10-20% hydrogen peroxide, and up to approximately 10% sulfuric acid, by volume. More specifically, the DSP solution comprises approximately 80% water, approximately 15% hydrogen peroxide, and approximately 5% sulfuric acid, by volume.

After soaking, the multi-component electrode is rinsed with de-ionized water (DIW) to complete the metal ion removal step (see step 200). Aluminum, graphite, and other materials used to construct an otherwise silicon-based multi-component electrode are potential sources of contamination. The present inventors have recognized that the risk contamination from aluminum and other multi-component electrode materials during rinsing can be reduced by ensuring that the temperature of the de-ionized water that is used to remove metal ions and contaminants from the multi-component electrode is approximately 20±5° C. or, in some cases, lower than 20±5° C. In contrast, typical high temperature, warm water rinses would be above 20±5° C. and would promote contamination. To further prevent contamination during rinsing, it may also be beneficial to ensure that the electrical resistivity of the de-ionized water that is used to remove metal ions and contaminants from the multi-component electrode is at least approximately 12 MΩ-cm because removal of ions causes the resistivity of to increase, providing a convenient measurement for the exact extent of deionization.

Following metal ion removal, various surfaces of the multi-component electrode can be polished (see step 300). As is illustrated schematically in FIG. 4, the surface polishing can be done under a substantially continuous flow of de-ionized water presented at a temperature of approximately 20±5° C., or lower, and at a flow rate sufficient to inhibit elevation of the temperature of the de-ionized water beyond approximately 25° C. at the electrode surface. It is contemplated, however, that the broadest aspects of the present disclosure are not limited to particular polishing steps or procedures. Typically, as will be apparent from the detailed description of one suitable reconditioning procedure below, the polishing step can include a number of component polishing steps that will vary from each other with regard to the specific manner in which polishing is executed. The polishing step may be followed by an ultrasonic cleaning operation where the multi-component electrode is disposed in de-ionized water and is subjected to ultrasonic energy (see step 400). Again, to reduce the likelihood of contamination, the temperature of the de-ionized water used in the ultrasonic cleaning operation should be approximately 20±5° C. or, in some cases, lower than 20±5° C. In some cases, ultrasonic cleaning of the multi-component electrode may be enhanced by ensuring that the de-ionized water used in the ultrasonic cleaning operation has an ultrasonic power density between approximately 1.5 Watts/cm$^2$ and approximately 3.1 Watts/cm$^2$, at approximately 40 kHz.

Further contamination can be removed from silicon surfaces of the multi-component electrode by treating the polished multi-component electrode with a mixed acid solution (see step 500). The mixed acid solution may take a variety of forms, including those disclosed in U.S. Pat. No. 7,247,579 and US Pub. Nos. 2008/0015132, 2006/0141802, 2008/0092920, 2006/0138081. In one embodiment of the present disclosure, the mixed acid solution comprises hydrofluoric acid, nitric acid, acetic acid, and water and the electrode surface are treated by wiping the surfaces with the mixed acid solution.

The present disclosure contemplates a variety of techniques for treating the electrode surfaces with the mixed acid solution. For example, where the multi-component electrode comprises a showerhead electrode, the wiping operation can be executed while the electrode is held in a fixture and pressurized nitrogen gas is directed through showerhead passages of the showerhead electrode to prevent uptake of the mixed acid solution into the showerhead passages. More generally, the present disclosure contemplates: methods where the mixed acid solution is applied to the electrode surface using one or more rollers that only contact the silicon surface of the electrode; methods where the gas volume at the backing-plate side of the multi-component electrode is pressurized while the mixed acid solution is contacted with the electrode surface; methods where the mixed acid solution is contacted with the silicon surface and allowed to evaporate before capillary action can draw the solution through the showerhead passages of the electrode; and methods where a corrosion inhibitor is applied to the backing plate of the multi-component electrode and/or the bonding material at the interface of the electrode and the backing plate.

Typically, it will be preferable to complete the mixed acid treatment by rinsing the treated multi-component electrode with de-ionized water having properties similar to those recited above with reference to step 200. It may also be preferable, to treat the multi-component electrode by repeatedly wiping the electrode surfaces with the mixed acid solution after rinsing with de-ionized water. In addition, it will also be helpful in many cases to follow the aforementioned contaminant removal operations with baking, $N_2$ blow-off, and electrode bagging steps.

In practicing the present disclosure, it may be preferable to ensure that the following equipment is available:

An ultrasonic tank with a power density of 10-20 Watts/in$^2$ (at 40 kHz) with DIW overflow (Turnover of DIW in ultrasonic tank should be greater than 1.5);

A variable speed turntable used for electrode polishing;

A dry Ice ($CO_2$) pellet cleaning system (A plastic nozzle is recommended to avoid metal contamination and damage. Recommended nozzles are: (1) 6-inch or 9-inch long 0.125-inch bore, plastic nozzle, or (2) 6-inch or 9-inch long, 0.3125" bore, plastic nozzle. Wrapping of a metal nozzle in plastic protective tape may be acceptable.);
A polish Fixture for mounting electrodes for polishing;
A Magnum rinsing gun model 6735K4 for DIW water, $N_2$, or dry air cleaning at 40-50 psi provided by McMaster Carr;
Polypropylene or polyethylene tanks to transport silicon electrodes in DIW and to soak electrodes;
A flushing and/or recirculation system to support 7.0±1.0 GPM DIW flow rate at T=20.0±5.0° C. DIW, a mixture of DIW/$N_2$ gas or 2% IPA aqueous solution will be used for flushing. The system should be cleanroom compatible with three in-situ filters, two particle filters (1.0 μm and 0.2 μm in series), and one Mykrolis Protego metal purifier/filter;
A wet bench for DI water rinsing and acid wiping;
A temperature sensor or thermometer to measure U/S tank DIW temperature during U/S and water temperature in the recirculation system;
A cleanroom vacuum bag machine with nitrogen purge;
A baking oven, class 100 cleanroom compatible;
Class 10000 and 10 cleanrooms;
A standard nozzle gun for DI water rinsing during polishing and during rinsing.
A magnum rinsing gun model 6735K8 for DIW, $N_2$, or dry air cleaning at 40-50 psi (provided by McMaster Carr).
A clean and soft CMP pad to cover polishing fixture and to protect non-silicon surfaces of electrodes (Preclean the pads with IPA before placing the electrode.);
Diamond 3.5 inch polishing disks (140, 180, 220, 280, 360, and 800 grits) and a 3.0 inch pointed tip polisher with a diamond tip;
Polyimide film tape;
Teflon thread seal tape;
Class 100 acid resistance cleanroom wiper for rinsing and wiping;
Semiconductor grade hydrogen fluoride (HF), conforming to SEMI Spec. C28-0301, grade 2 or better;
Semiconductor grade nitric acid ($HNO_3$), conforming to SEMI Spec. C35-0301, grade 2 or better;
Semiconductor grade acetic acid ($CH_3COOH$), conforming to SEMI Spec. C18-0301, grade 1 or better;
Semiconductor grade sulfuric acid ($H_2SO_4$), conforming to SEMI spec. C44-0301, grade 2 or better;
Semiconductor grade hydrogen peroxide ($H_2O_2$) conforming to SEMI spec. C30-1101, grade 2 or better;
Nylon, class 100, 2 mils thick bags for electrode bagging;
Polyethylene cleanroom bags, 4-mils thick, meeting specification IEST-STDCC1246D, level 100;
Class 100 cleanroom nitrile gloves;
Class 100 antistatic vinyl gloves (to be used inside the cleanroom only, should not be used for soaking and cleaning with IPA);
DSP solution parameters:

|  | Bulk Concentration | Volume Ratio | Volume for 1 Liter |
| --- | --- | --- | --- |
| Sulfuric Acid | 96% (w/v) | 1 | 50 ml |
| Hydrogen Peroxide | 31% (w/v) | 3 | 160 ml |
| DIW | 100% | 16 | 790 ml |

Mixed Acid solution parameters

|  | Bulk Concentration | Volume Ratio | Volume for 1 Liter |
| --- | --- | --- | --- |
| Hydrofluoric Acid | 49% (w/v) | 1 | 10 ml |
| Nitric Acid | 69% (w/v) | 30 | 300 ml |
| Acetic Acid | 100% (w/v) | 15 | 150 ml |
| DIW | 100% | 54 | 540 ml |

To avoid damaging parts during the reconditioning process, care should be taken to avoid soaking the multi-component electrode in isopropyl alcohol (IPA) which can cause staining. The electrode may be wiped with a cleanroom wipe moistened with a minimal amount of IPA. If stains on the silicon surfaces of the multi-component electrode are still present after wiping with a minimal amount of IPA, the multi-component electrode may be mounted in a suitable carrier and wiped with a freshly mixed 15% potassium hydroxide (KOH) solution until the stains are gone. As is noted above with reference to treatment of the multi-component electrode with the mixed acid solution, the KOH wiping operation can be executed while the electrode is held in a fixture and pressurized nitrogen gas is directed through showerhead passages of the showerhead electrode to prevent uptake of the mixed acid solution into the showerhead passages. In one embodiment, the KOH wiping operation precedes the mixed acid wiping step; however, other reconditioning sequences are contemplated.

If stains on the non-silicon surfaces of the multi-component electrode are still present after wiping with a minimal amount of IPA, the multi-component electrode may be mounted in a suitable carrier or merely placed on a clean surface and wiped with an acid resistant clean room cloth soaked with a minimum amount of freshly mixed Al pickle solution until the stains are gone. More specifically, the Al pickle solution may be prepared as follows:

|  | Bulk Concentration | Volume Ratio | Volume for 1 Liter |
| --- | --- | --- | --- |
| Hydrofluoric Acid | 49% (w/v) | 4 | 40 ml |
| Nitric Acid | 69% (w/v) | 20 | 200 ml |
| DIW | 100% | 76 | 760 ml |

Aluminum is readily stained by many chemicals, so avoid contact with any chemical not specified in the procedure. Before oven baking, blow-dry the part to ensure there are no water droplets on or in the holes of the part to avoid staining of aluminum. Do not use DIW at temperatures greater than 25° C. to avoid contamination, particularly from aluminum.

As is noted above, the multi-component electrode to be reconditioned may be cleaned initially with dry ice pellets. The following conditions may be used for dry ice ($CO_2$) pellet cleaning: Air Pressure ≦40 psi; pellet feed rate ≦0.3 Kg/minute. A plastic nozzle should be used to avoid metal contamination and scratching the part. Other combinations of nozzles and air flow may be acceptable if they do not cause part damage. Protect the backside of the part from damage and contamination during $CO_2$ pellet cleaning by holding it with a hand, placing it on a soft surface, or setting it on a stand such as a tripod rinsing fixture. Also, do not allow the part to remain in contact with water, which condenses on the part, for long periods of time. Blast the silicon surface with dry ice pellets to remove chamber deposition. Cover the entire surface of the silicon including the edges. Also, direct the Dry Ice down any electrode holes to clean inside. If some deposition was missed during the first pass, repeat the pellet cleaning procedure and re-inspect until all deposition is gone. In addition, the non-silicon surfaces of the electrode may also be blasted with Dry Ice Pellets to remove residue from any gaskets. Avoid excessive $CO_2$ cleaning which may damage the multi-component electrode.

The DSP soak process may take place outside of a cleanroom. In one embodiment, the multi-component electrode is immersed in the DSP solution for 15 minutes and is agitated occasionally in the solution. The subsequent rinsing step may comprise a 1 minute spray rinse and a longer Magnum gun rinse (3 minutes on silicon side, 2 minutes on backing plate side, and 3 minutes on silicon side).

The DSP soak may be followed by a sidewall and step surface polishing step. Generally, the polishing process should take place in a polishing room and the polishing process needs to be completed same day it started. During polishing, polyimide tape can be used to mask the outer diameter of the multi-component electrode, taking care to cover the interface between the silicon electrode material and the backing plate. The multi-component electrode should be rinsed prior to polishing and constant DIW flow should be maintained during polishing. 800 grit diamond pads and a three inch 1350 diamond tip can be used to for the sidewall and step surface polishing. It may take 1-2 minutes of polishing time to remove the sidewall deposition completely, followed by appropriate DIW rinsing, cleanroom wiping, blow drying, inspection, etc.

Electrode polishing should be executed in a polishing room with suitable gloves (see above) and may be facilitated with the use of a polishing fixture that complements the dimensions of the multi-component electrode to be polished. An 80-120 rpm polishing turntable can also be helpful. Care should also be taken to keep a consistent flow of DIW during the polishing procedure. If polishing needs to be interrupted, the electrode should be soaked in DIW. Progressively higher grit diamond disks can be used in the polishing procedure. Again, polishing should be followed by appropriate DIW rinsing, cleanroom wiping, blow drying, inspection, etc.

The ultrasonic cleaning operation described herein can be performed at 20.0±5.0° C. for 10 minutes in DIW in a class 10000 cleanroom. The part can be rotated during ultrasonic cleaning (e.g., once every five minutes) and may be rinsed and placed in a DIW bath in anticipation of subsequent mixed acid treatment, which should be started within 2 hours of the ultrasonic cleaning operation.

For the mixed acid treatment, a Magnum water gun mixture of DIW and $N_2$ (or clean, dry air—CDA) at 40-50 psi can be used to clean the multi-component electrode (3 minute rinse on silicon side, 2 minutes on non-silicon side, 3 minutes on silicon side). Treatment may be facilitated by installing the multi-component electrode in or on a carrier and placing it on an acid wipe stand, both of which should allow convenient access to the surfaces to be treated. The concepts of the present disclosure are not limited to the use of specific carriers or wiping stands but the carriers and wiping stand can be used to enhance the reconditioning process. FIGS. 4A, 4B, and 5-10 illustrate a backside-mounted electrode carrier suitable for securing a multi-component electrode similar to that illustrated in FIG. 2. FIGS. 11-17 illustrate a peripherally-engaging electrode carrier suitable for securing a multi-component electrode similar to that illustrated in FIG. 3.

Figure 4A:
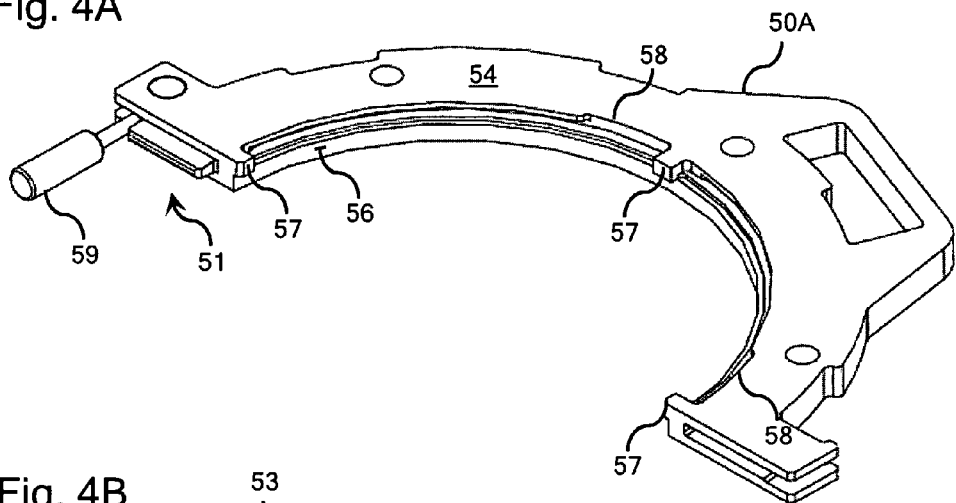
FIGS. 4A and 4B illustrate the two primary component parts of a backside mounted electrode carrier according to one embodiment of the present disclosure.
Figure 4B:
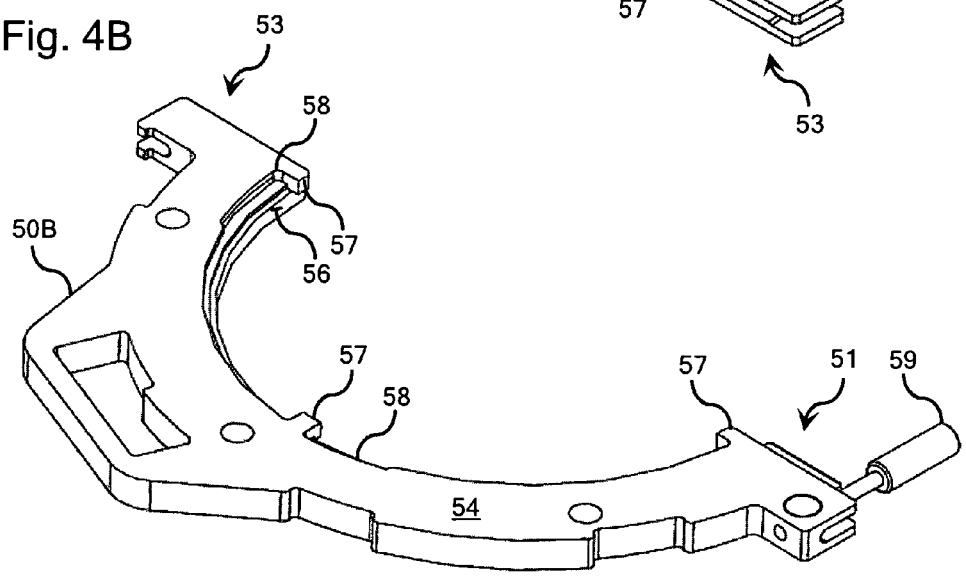
Figure 5:
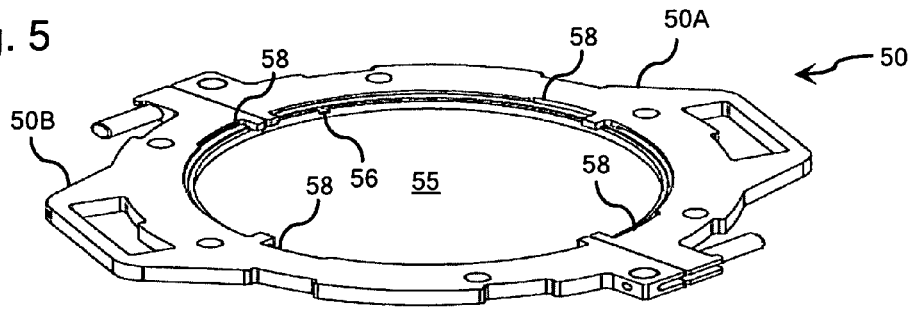
FIG. 5 illustrates the assembled components of FIGS. 4A and 4B.

More specifically, FIGS. 4A and 4B illustrate the two primary component halves 50A, 50B of a backside mounted electrode carrier 50 according to one embodiment of the present disclosure. FIG. 5 illustrates the assembled components of FIGS. 4A and 4B. Generally, as is further illustrated in FIGS. 5-8, the electrode carrier 50 comprises a frontside 52, a backside 54, and an electrode accommodating aperture 55.

The electrode accommodating aperture 55 comprises a sidewall structure 56 that is configured to limit lateral movement of an electrode 20 positioned in the electrode accommodating aperture 55. For the purposes of describing and defining the present invention, it is noted that "lateral" movement comprises movement in the plane of the carrier 50, as opposed to "axial" movement which comprises movement along an axis extending through the aperture 55, parallel to the plane of the carrier 50.

Figure 6:
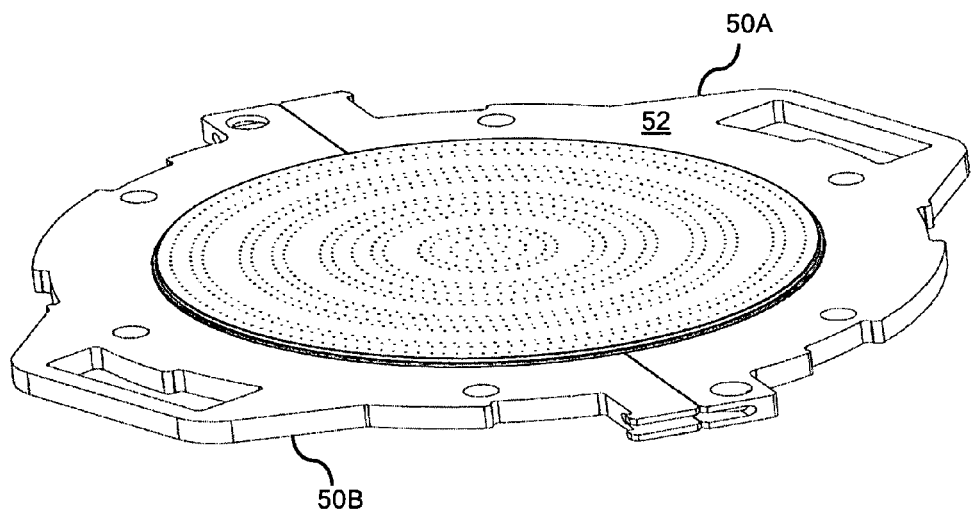
FIG. 6 illustrates a multi-component electrode held in the assembled components of the backside mounted electrode carrier illustrated in FIG. 5.
Figure 7:
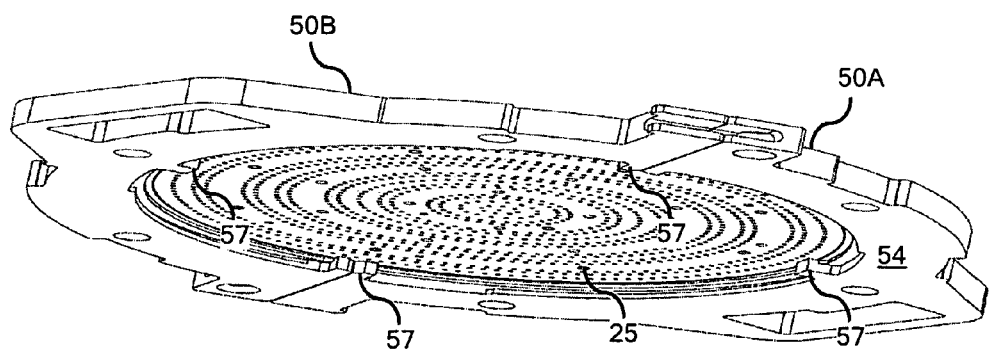
FIG. 7 illustrates the backside of the assembled carrier of FIG. 6.

The electrode accommodating aperture further comprises one or more sidewall projections 57 that are configured to support the weight of the electrode 20 as it rests upon the sidewall projections 57. FIGS. 6 and 7 show the electrode 20 resting on the sidewall projections 57. In the illustrated embodiment, the sidewall projections 57 comprise relatively discrete tabs but it is contemplated that the sidewall projections 57 may take a variety of forms and may be provided in a variety of numbers along the sidewall structure 56. For example, at one extreme a single, continuous sidewall projection may be provided along the entire inner periphery of the sidewall structure 56 as a circumferential ledge.

As is illustrated in FIGS. 4A and 4B, the electrode accommodating aperture 55 of the illustrated embodiment comprises a split aperture configuration including two primary component halves 50A, 50B engaged via a pair of tongue-in-groove interfaces 51, 53. Each of the component halves can be secured to each other at the interfaces 51, 53 with suitable engaging hardware, such as a pair of threaded PEEK inserts 59. It is contemplated, however that the electrode carrier does not necessarily have to be presented in two component halves, as long as the electrode 20 can be conveniently placed in the electrode-accommodating aperture 55. It is also contemplated that the electrode 20 can be positioned in the electrode-accommodating aperture 55 or the two component halves 50A, 50B of the carrier 50 can be positioned about the electrode 20 with the aid of a carrier installation stand configured to allow the electrode to sit on a controlled clean surface at the proper height to allow the carrier to be placed around the electrode. The carrier would also be placed on a controlled, clean surface.

Figure 8:
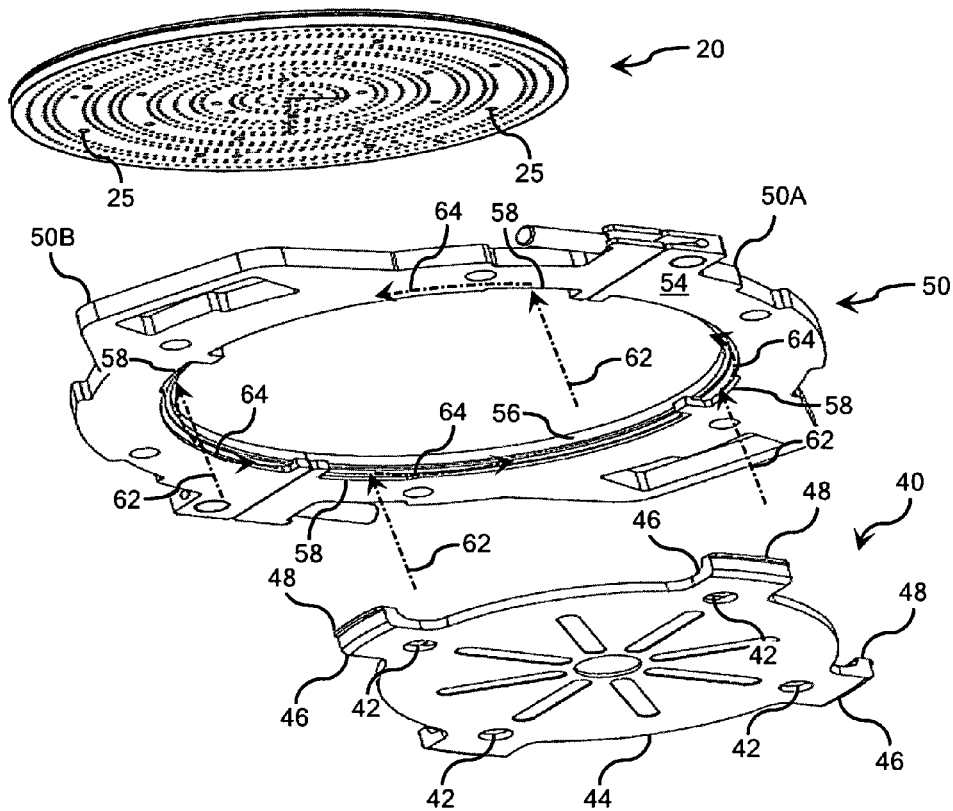
FIG. 8 is a partially exploded view of the assembled carrier of FIG. 6, including a backside mounting plate.

FIG. 8 is a partially exploded view of an assembly comprising the inner showerhead electrode 20, the backside mounted electrode carrier 50, and electrode mounting hardware 40. As will be described in further detail herein, the electrode mounting hardware 40 is configured to engage the electrode 20 from the backside 54 of the carrier 50 and urge the electrode 20 against the sidewall projections 57 so as to limit axial movement of the electrode 20 in the electrode accommodating aperture 55.

Figure 9:
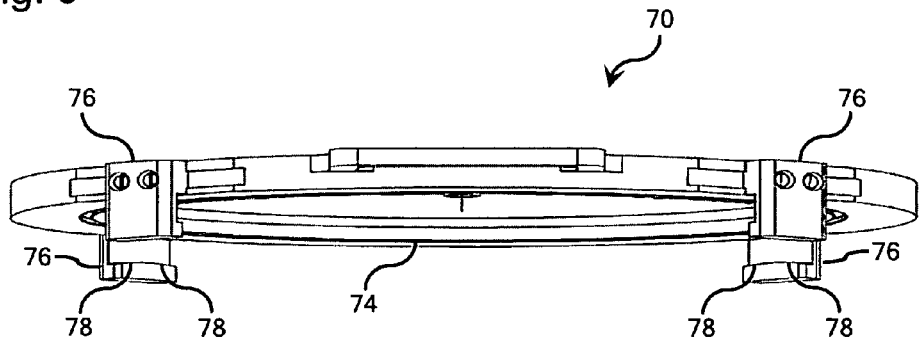
FIG. 9 is an isometric illustration of a purge plate for use with the assembled carrier of FIG. 6.

Referring collectively to FIGS. 7 and 8, the electrode mounting hardware 40 comprises electrode engaging extensions 42 and a carrier brace 44. The electrode engaging extensions 42 may, for example, comprise threaded PEEK screws or other types of inserts that are configured to engage corresponding threaded or non-threaded bores 25 in the rear face 28 of the electrode 20 and, in cooperation with the carrier brace 44, which is configured to engage the backside 54 of the carrier 50, urge the rear face 28 of the electrode 20 against the sidewall projections 57 of the carrier 50. The mounting hardware 40 will simultaneously urge the carrier brace 44 against the backside 54 of the electrode carrier 50 to effectively secure the electrode 20 in the electrode accommodating aperture 55. Because of the relatively short length of the electrode engaging extensions 42, only the head portions thereof are illustrated in FIG. 8. FIG. 9, which is discussed in further detail below, also illustrates the manner in which the electrode engaging extensions 42 engage the bores 25 in the rear face 28 of the electrode 20.

Although the embodiment illustrated in FIGS. 7 and 8 comprises a carrier brace 44 that is configured as a relatively elaborate spider plate comprising a plurality of bracing legs 46, it is contemplated that the electrode mounting hardware 40 may be provided in a variety of forms, which may or may not include electrode engaging extensions 42 or a carrier brace 44. In practicing this aspect of the present disclosure all that is required is some type of hardware that engages the electrode 20 from the backside 54 of the carrier 50 to urge the electrode 20 against one or more sidewall projections 57 to limit axial movement of the electrode 20 in the carrier 50. The engagement with the electrode 20 should be non-permanent and may be by mechanical, chemical, magnetic, or any other suitable means.

In one embodiment, the backside 54 of the electrode carrier 50 comprises a plurality of receiving slots 58, each of which is configured to secure a corresponding end portion 48 of one of the bracing legs 46. As is illustrated in FIGS. 8 and 10, the receiving slots 58 and the end portions 48 of the bracing legs 46 define a twist-lock configuration where the end portions 48 of the bracing legs 46 are inserted into the receiving slots 58 along an axial component 62 of a twist-lock pathway and, once in the receiving slots 58, are rotated to a secure position along a rotational component 64 of the twist-lock pathway.

The precise location of the secure position along the rotational component 64 of the twist-lock pathway is established by rotating the carrier brace 44 to align the aforementioned electrode engaging extensions 42 with the corresponding bores 25 in the electrode 20. The electrode mounting hardware 40 may comprise a plurality of electrode engaging extensions 42 and, to permit convenient alignment, the rear face 28 of the electrode 20 may comprise an array of bores 25 configured to receive the electrode engaging extensions 42 in a plurality of different orientations.

Figure 10:
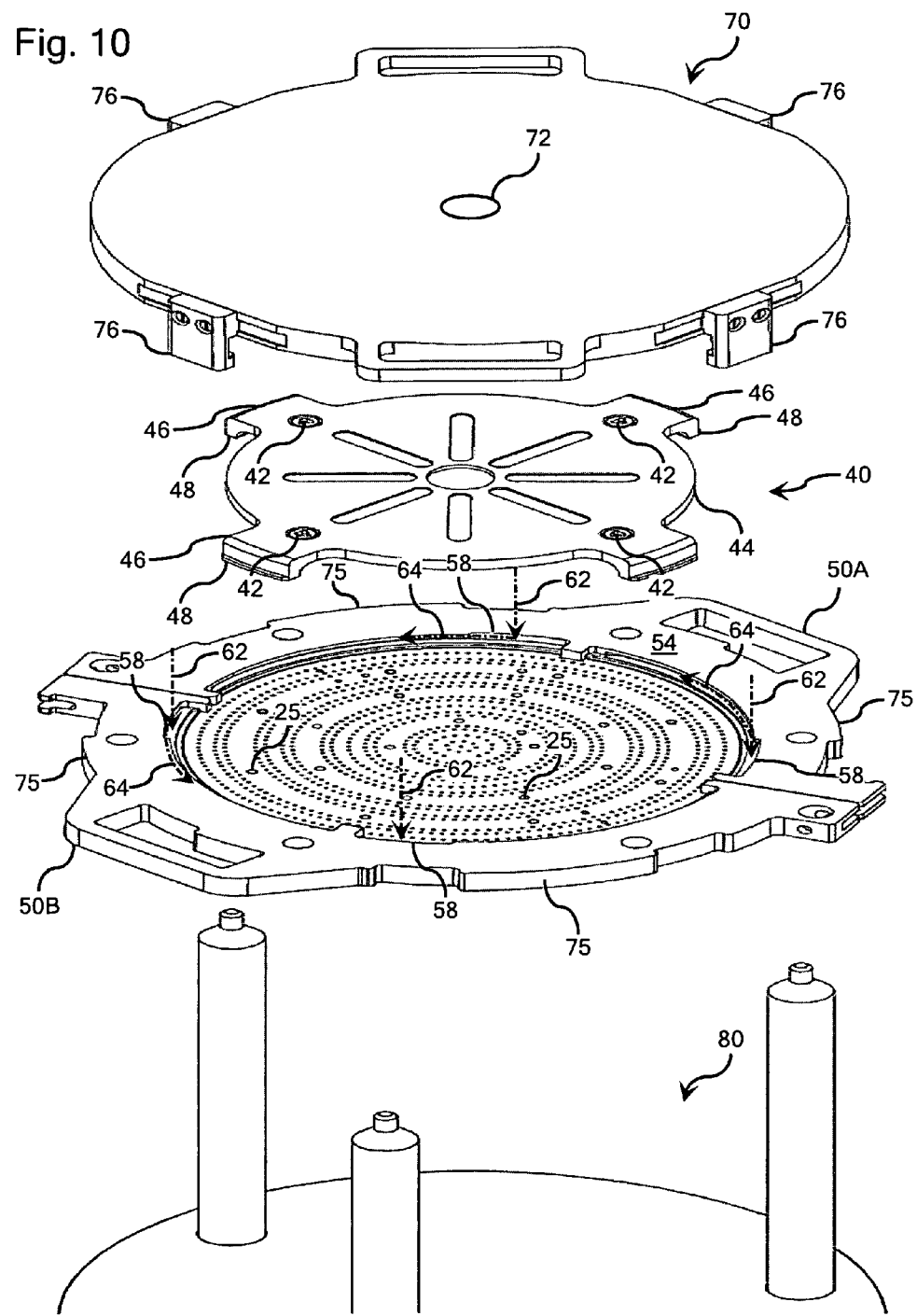
FIG. 10 is a partially exploded view of the assembled carrier of FIG. 6 and an associated purge plate and tripod stand for use with the carrier.

Referring now to FIGS. 9 and 10, in another embodiment, the assembly further comprises a purge plate 70 comprising a purge gas input port 72 and a backside seal 74 that interfaces with the backside 54 of the electrode carrier 50 to form a sealed purge gas chamber along the rear face 28 of the electrode 20. A suitable purge gas, like nitrogen or clean dry air, can be presented to the sealed purge gas chamber at relatively high pressure to purge the gas passages 26 of the electrode 20 before, during, or after other electrode reconditioning operations, the subject matter of which is beyond the scope of the present disclosure. For the purposes of describing and defining the present invention, it is noted that "reconditioning" operations generally refer to a variety of processes for treating a component and include, but are not limited to, chemical treatment, polishing, cleaning, etc.

The electrode carrier 50 can be provided with a plurality of purge plate flanges 75 to facilitate installation of the purge plate 70, which comprises a plurality of purge plate legs 76 that are configured to interface with the purge plate flanges 75. More specifically, the purge plate legs 76 comprise tapered flange engaging surfaces 78 that are configured to compress the backside seal 74 between the purge plate 70 and the backside 54 of the electrode carrier 50 upon engagement of the backside seal 74 with the backside 54 of the electrode carrier 50 and rotation of the purge plate 70 relative to the electrode carrier 50. In the illustrated embodiment the flange engaging surfaces 78 define a bi-directional taper to permit compression upon rotation of the purge plate 70 in the clockwise and counterclockwise directions.

Also illustrated in FIG. 10 is a tripod stand 80 that may be used to support the assembly during reconditioning operations. The tripod stand comprises at least three carrier supports that interface with the frontside 52 of the electrode carrier 50.

To reduce the possibility of contamination during reconditioning procedures, the various assembly components described herein can be fabricated using materials that are resistant to oxidation or other process-related degradation. For example, and not by way of limitation, the materials should be chemically resistant to isopropyl alcohol, sulfuric acid, hydrogen peroxide, hydrofluoric acid, nitric acid, acetic acid, and the like. Suitable materials include, but are not limited to, polymers such as polypropylene and polycarbonate for components like the carrier body and PEEK for components like the threaded inserts 59 and the electrode engaging extensions 42.

Figure 11:
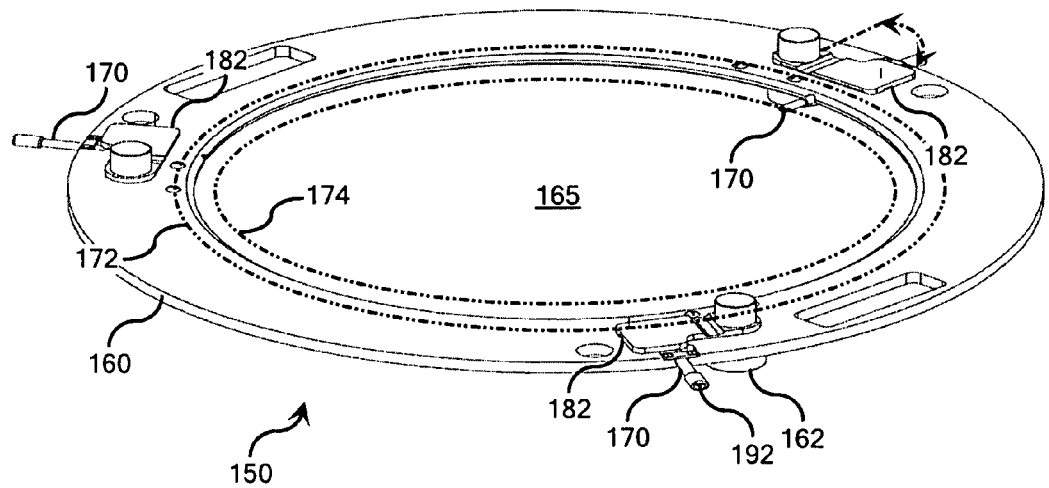
FIG. 11 illustrates a peripherally engaging electrode carrier according to one embodiment of the present disclosure.
Figure 12:
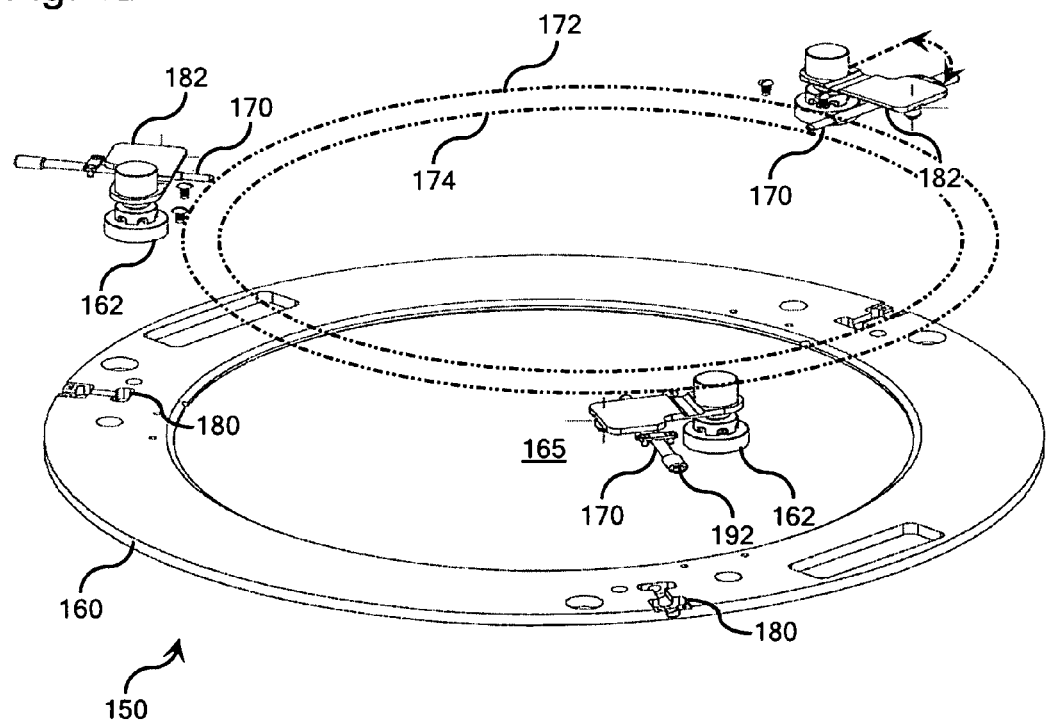
FIG. 12 is a partially exploded view of the carrier illustrated in FIG. 11.

Although the particular features of the peripherally engaging carrier illustrated herein may vary, one particular configuration according to the present disclosure is illustrated herein with reference to FIGS. 11-17. More specifically, FIGS. 11 and 12 illustrate a peripherally engaging electrode carrier 150 that can be used to hold any of a variety of types of electrodes including, but not limited to, the outer ring-shaped electrode 30 illustrated in FIGS. 1 and 3. Generally, the peripherally engaging electrode carrier 150 comprises a carrier frame 160 and a plurality of reciprocating electrode supports 170.

The carrier frame 160 comprises an electrode accommodating aperture 165 in which the outer ring-shaped electrode 30 can be positioned. The backing plate 34 of the electrode 30 comprises a plurality of mounting recesses 35 formed about its periphery. The reciprocating electrode supports 170 are configured to reciprocate between an outer retracted periphery 172 and an inner electrode-engaging periphery 174, which is smaller than the electrode accommodating aperture 165. When positioned at the inner electrode-engaging periphery 174, the reciprocating electrode supports 170 will extend into the mounting recesses 35 and support the electrode 30. When positioned at the outer retracted periphery 172, the reciprocating electrode supports 170 provide full clearance to the electrode accommodating aperture 160. Although the mounting recesses 35 are illustrated as axial bores, it is noted that any of a variety of recess configurations may be employed in practicing the present invention.

Although the reciprocating electrode supports 170 of the present disclosure are illustrated herein with reference to a linearly reciprocating keyway configuration, it is contemplated that a variety of mechanical configurations can be employed to accomplish reciprocating movement of the electrode supports 170 between the outer retracted periphery 172 and an inner electrode-engaging periphery 174. For example, it is contemplated that the reciprocating movement could be linear, rotational, or could follow a complex path having a plurality of linear and rotational components.

Referring to FIGS. 13-16, in the illustrated embodiment, each of the reciprocating electrode supports 170 is configured as a support pin that is aligned with a linear reciprocating path 175. The carrier frame 160 comprises a plurality of keyway slots 180, each of which is configured to define termination points A, B of the linear reciprocating path 175. More specifically, the reciprocating electrode support 170 comprises a keyway projection 162 that cooperates with the keyway slot 180 to restrict movement along the linear reciprocating path 175 beyond the termination points A, B.

Figure 15:
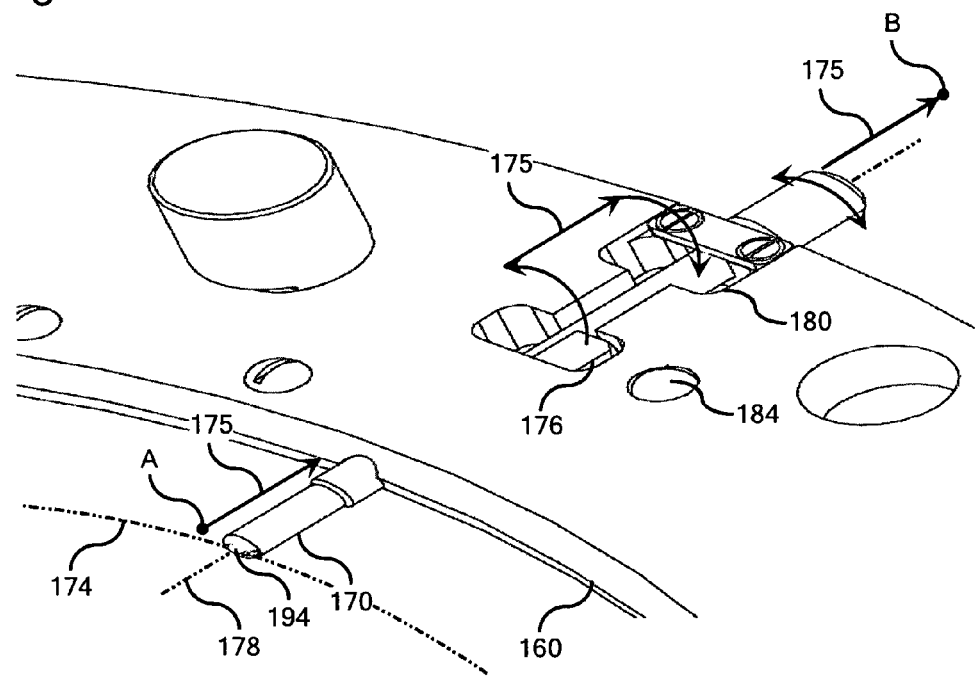
Figure 16:
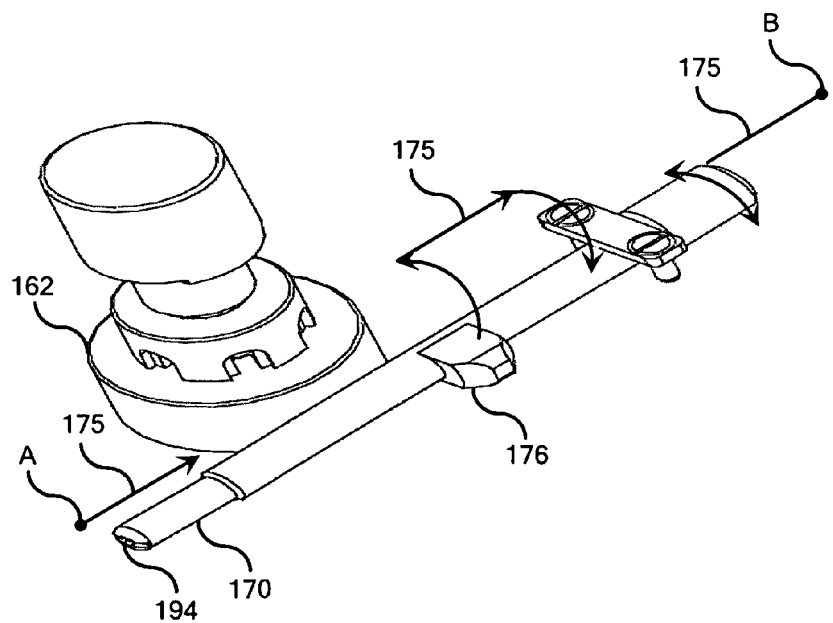

As is illustrated in FIGS. 15 and 16, the reciprocating electrode support 170 is rotatable about its longitudinal axis 178. By rotating the reciprocating electrode support 170 in the manner indicated in FIGS. 15 and 16, the keyway projection 176 can be rotated about the longitudinal axis 178 to transition from a stationary state, in which the keyway slot 180 restricts movement of the reciprocating electrode support 170 along the linear reciprocating path 175, to a reciprocating state, in which the reciprocating electrode support 170 can be moved freely along the linear reciprocating path 175 between the termination points A, B.

To secure the electrode 30 in the peripherally engaging electrode carrier 150, the mounting recesses 35 of the backing plate 34 are aligned with the linear reciprocating paths 175 of the reciprocating electrode supports 170 and each reciprocating electrode support 170 is advanced from termination point B to the inner electrode-engaging periphery 174 by rotating the keyway projection 176 to a position outside of the keyway slot 180 and sliding the reciprocating electrode support 170 to the termination point A. Once termination point A is reached, the keyway projection 176 is returned to the keyway slot 180, a resting state that is illustrated in FIG. 15.

Figure 13:
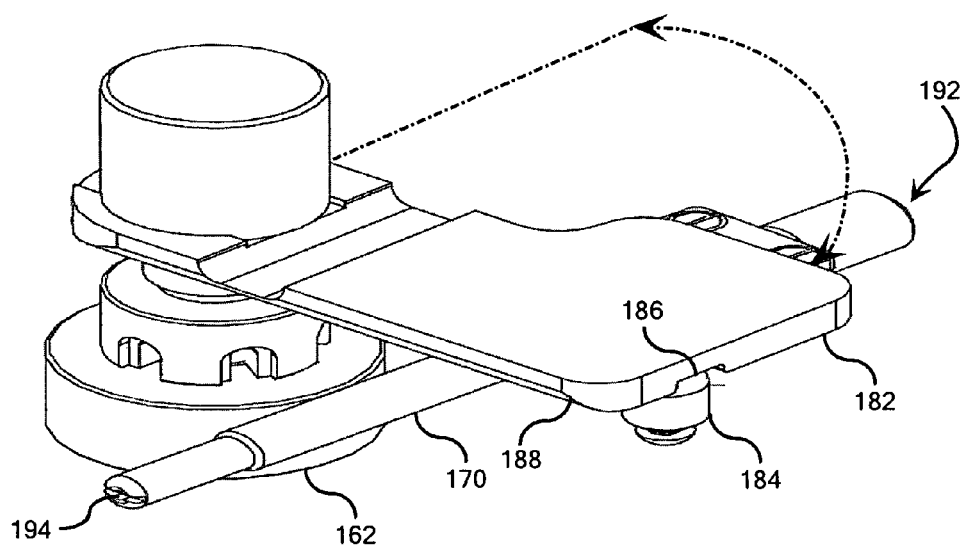
FIGS. 13-16 illustrate a reciprocating electrode support for use in peripherally engaging electrode carriers according to the present disclosure, and the manner in which they reciprocate.
Figure 14:
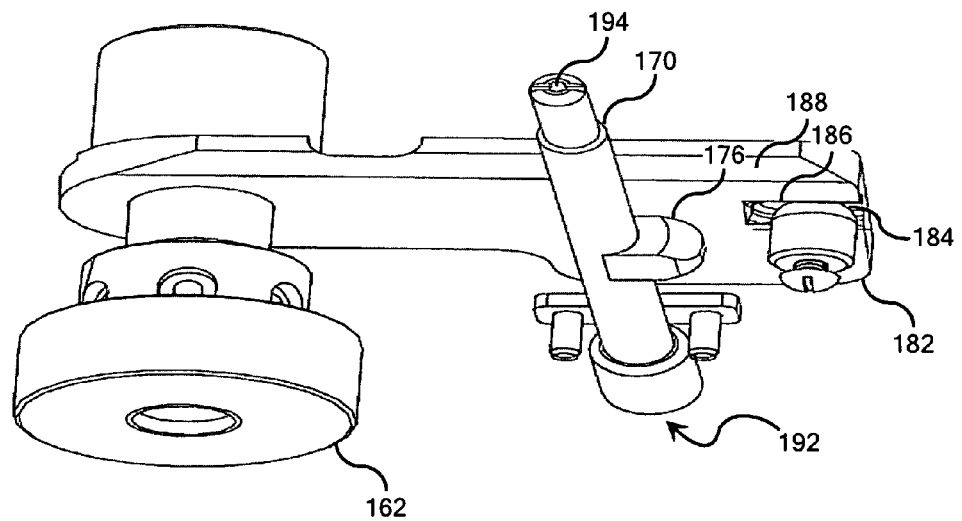

Respective keyway locking plates 182, or other similar hardware, can be provided to fix the reciprocating electrode supports 170 in an advanced or retracted position by preventing rotation of the keyway projections 176. As is illustrated in FIGS. 11 and 13, the keyway locking plates 182 can be rotated back and forth from the locking position about respective pivot axes defined by a set of carrier supports 162. Locator nubs 184, or other similar hardware, may also be provided on the carrier frame 160 to cooperate with receiving slots 186 on the locking plates 182. The locator nubs 184 and the receiving slots 186 of the locking plates 182 can be used to help locate the locking plates 182 over respective ones of the keyway slots 180 to lock-down the keyway projections 176 and the reciprocating electrode supports 170 in a stationary state. In the illustrated embodiment, the locking plates 182 further comprise leading beveled edges 188 that are positioned to facilitate receipt of the locator nubs 184 in the receiving slots 186.

The present inventors have recognized that the reciprocating electrode supports 170 will at least partially obstruct portions of the mounting recesses 35 during reconditioning processes. To address this issue, each reciprocating electrode support 170 can be provided with a purge gas passageway that extends from a purge gas inlet 192 to a purge gas outlet 194 that would be positioned in the mounting recess 35 when an electrode 30 is engaged in the carrier 150. In the illustrated embodiment, the purge gas passageway extends along the longitudinal axis of the reciprocating electrode support 170 and the inlet/outlet configuration is well-suited for coupling a pressurized purge gas supply to the purge gas inlet 192. It is contemplated that any number of passageway configurations would be effective in practicing the present invention, as long as the passageway encourages passage of a pressurized or non-pressurized purge gas through the mounting recess 35.

Figure 17:
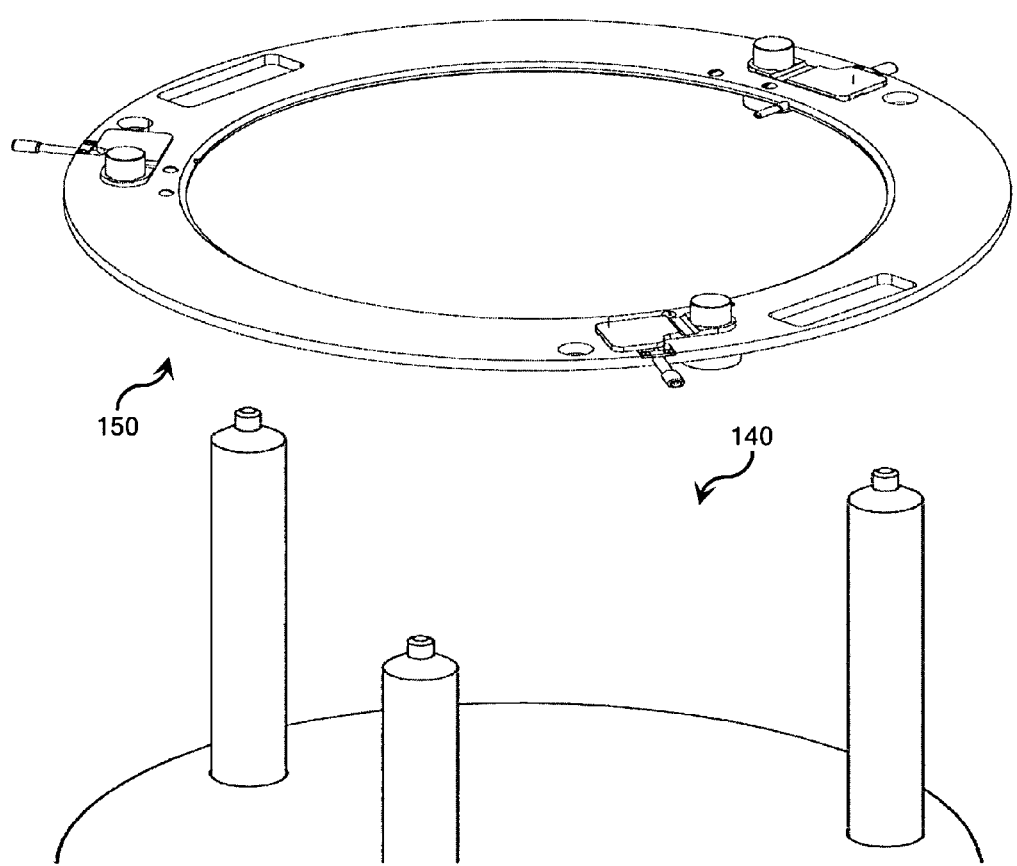
FIG. 17 illustrates a peripherally engaging electrode carrier and an associated tripod stand for use with the carrier.

FIG. 17 illustrates a tripod stand 140 that may be used to support the peripherally engaging electrode carrier 150 during electrode reconditioning operations. The tripod stand 140 comprises at least three carrier supports that can interface with either side of the electrode carrier 150 because the electrode carrier 150 is configured to hold an electrode in a stationary position regardless of its orientation. For the purposes of describing and defining the present invention, it is noted that "reconditioning" operations generally refer to a variety of processes for treating a component and include, but are not limited to, chemical treatment, polishing, cleaning, etc.

It is contemplated that electrodes can be positioned in the electrode-accommodating aperture 165 of the peripherally engaging electrode carrier 150 with the aid of a carrier installation stand that is configured to allow the electrode to sit on a controlled clean surface at the proper height to allow the electrode to be positioned in the electrode accommodating aperture 165.

A freshly mixed acid solution can be used to wipe the multi-component electrode surface. The wiping treatment will be relatively brief, e.g., about 40 sec for electrodes similar to those illustrated in FIGS. 2 and 3, but the wiping operation may be repeated multiple times with intermittent DIW spray-rinse steps. When complete, the mixed acid treatment may be followed by a more thorough DIW rinse, similar to that used in preparation for the acid treatment process. In addition, following the rinse, the silicon surfaces of the multi-component electrode may be wiped with DIW, isopropyl alcohol, or combinations thereof to remove any smut and may be subject to a DIW power flush in a suitable flushing fixture, an example of which is illustrated in US Pub. No. 2008/0092920, the disclosure of which is incorporated herein by reference, to the extent that it is consistent with the subject matter of the present disclosure. Further DIW rinsing may be employed after the power flush. It is also contemplated that the aforementioned smut removal, power flushing, and rinsing steps may be repeated a number of times and may eventually be concluded with a final ultrasonic cleaning treatment at 20.0±5.0° C. for 10 minutes in DIW in a class 10 cleanroom, taking care to rotate the part at least once.

After ultrasonic cleaning, an additional mixed acid wiping operation and a subsequent rinsing operation may again be executed and may be followed by blow drying and baking. Baking may be facilitated by placing the multi-component electrode, with or without a carrier, on a bake stand. Suitable baking conditions will vary but for illustrative purposes, it is contemplated that the part may be baked 45 to 120 minutes at 120° C., or until completely dry. After cooling, the part can be subject to filtered $N_2$ blow-off and can be vacuum sealed in a cleanroom bag using a bagging assist stand. Double bagging in a $N_2$ purged, vacuum sealed outer bag may also be preferred.

It is noted that recitations herein of a component of the present disclosure being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A process for reconditioning a multi-component electrode comprising a silicon electrode bonded to an electrically conductive backing plate, the process comprising:
   removing metal ions from the multi-component electrode by soaking the multi-component electrode in a substantially alcohol-free DSP solution comprising sulfuric acid, hydrogen peroxide, and water and rinsing the multi-component electrode with de-ionized water;
   polishing one or more surfaces of the multi-component electrode following removal of metal ions there from; and
   removing contaminants from silicon surfaces of the multi-component electrode by treating the polished multi-component electrode with a mixed acid solution comprising hydrofluoric acid, nitric acid, acetic acid, and water and by rinsing the treated multi-component electrode with de-ionized water.

2. A process as claimed in claim 1 wherein the DSP solution comprises a majority of water, by volume.

3. A process as claimed in claim 2 wherein the DSP solution comprises more hydrogen peroxide than sulfuric acid, by volume.

4. A process as claimed in claim 1 wherein the DSP solution comprises at least approximately 80% water, by volume.

5. A process as claimed in claim 1 wherein the DSP solution comprises approximately 70-90% water, approximately 10-20% hydrogen peroxide, and up to approximately 10% sulfuric acid, by volume.

6. A process as claimed in claim 1 wherein the DSP solution comprises approximately 80% water, approximately 15% hydrogen peroxide, and approximately 5% sulfuric acid, by volume.

7. A process as claimed in claim 1 wherein the electrical resistivity the de-ionized water that is used to remove metal ions and contaminants from the multi-component electrode is at least approximately 12 MΩ-cm.

8. A process as claimed in claim 1 wherein the temperature of the de-ionized water that is used to remove metal ions and contaminants from the multi-component electrode is no more than approximately 20±5° C.

9. A process as claimed in claim 1 wherein the surface polishing is done under substantially continuous flow of de-ionized water presented at a temperature of no more than approximately 20±5° C. and at a flow rate sufficient to inhibit elevation of the temperature of the de-ionized water beyond approximately 25° C. at the electrode surface.

10. A process as claimed in claim 1 wherein:
    the contaminants are removed from silicon surfaces of the multi-component electrode by subjecting the multi-component electrode to an ultrasonic cleaning operation in de-ionized water prior to treating the polished multi-component electrode with the mixed acid solution;
    the temperature of the de-ionized water used in the ultrasonic cleaning operation is no more than approximately 20±5° C.; and
    the ultrasonic power density of the de-ionized water used in the ultrasonic cleaning operation is between approximately 1.5 Watts/cm$^2$ and approximately 3.1 Watts/cm$^2$ at approximately 40 kHz.

11. A process as claimed in claim 1 wherein the polished multi-component electrode is treated by wiping the electrode surfaces with the mixed acid solution.

12. A process as claimed in claim 11 wherein the multi-component electrode comprises a showerhead electrode and the wiping operation is executed while the electrode is held in a fixture and pressurized nitrogen gas is directed through showerhead passages of the showerhead electrode to prevent uptake of the mixed acid solution into the showerhead passages.

13. A process as claimed in claim 11 wherein the wiping operation is followed by a de-ionized water rinsing operation at a temperature of no more than approximately 20±5° C.

14. A process as claimed in claim 1 wherein stains are removed from the polished multi-component electrode by wiping the electrode surfaces with a KOH solution.

15. A process as claimed in claim 1 wherein stains are removed from the polished multi-component electrode by wiping the surfaces of the electrically conductive backing plate with a pickling solution comprising hydrofluoric acid, nitric acid, and water.

16. A process as claimed in claim 1 wherein the multi-component electrode comprises a silicon electrode bonded to an electrically conductive aluminum-based backing plate or an electrically conductive graphite-based backing plate.

17. A process as claimed in claim 1 wherein the multi-component electrode is configured as a showerhead electrode or a ring-shaped electrode configured to surround a showerhead electrode.

18. A process as claimed in claim 1 wherein the process further comprises removing contaminants by flowing $CO_2$ pellets against or across surfaces of the multi-component electrode at pressures not exceeding 40 psi.

19. A process as claimed in claim 1 wherein the multi-component electrode is treated to remove contaminants there from by repeatedly wiping the electrode surfaces with the mixed acid solution after rinsing with de-ionized water.

20. A process for reconditioning a multi-component electrode comprising a silicon electrode bonded to an electrically conductive aluminum-based backing plate, the process comprising:
    removing metal ions from the multi-component electrode by soaking the multi-component electrode in a substantially alcohol-free DSP solution comprising approximately 70-90% water, approximately 10-20% hydrogen peroxide, and up to approximately 10% sulfuric acid, by volume, and rinsing the multi-component electrode with de-ionized water, wherein the electrical resistivity the de-ionized water is at least approximately 12 MΩ-cm and the temperature of the de-ionized water is approximately 20±5° C.;
    polishing one or more surfaces of the multi-component electrode following removal of metal ions there from, wherein the surface polishing is done under substantially continuous flow of de-ionized water presented at a temperature of approximately 20±5° C. and at a flow rate sufficient to inhibit elevation of the temperature of the de-ionized water beyond approximately 25° C. at the electrode surface;

removing contaminants from silicon surfaces of the multi-component electrode by subjecting the multi-component electrode to an ultrasonic cleaning operation in de-ionized water prior to treating the polished multi-component electrode with a mixed acid solution comprising hydrofluoric acid, nitric acid, acetic acid, and water and by rinsing the treated multi-component electrode with de-ionized water, wherein the temperature of the de-ionized water used in the ultrasonic cleaning operation is approximately 20±5° C. and the ultrasonic power density of the de-ionized water used in the ultrasonic cleaning operation is between approximately 1.5 Watts/cm$^2$ and approximately 3.1 Watts/cm$^2$ at approximately 40 kHz.

* * * * *

UNITED STATES PATENT AND TRADEMARK OFFICE
CERTIFICATE OF CORRECTION

| | | |
|---|---|---|
| PATENT NO. | : 8,075,701 B2 | Page 1 of 1 |
| APPLICATION NO. | : 12/164294 | |
| DATED | : December 13, 2011 | |
| INVENTOR(S) | : Avoyan et al. | |

It is certified that error appears in the above-identified patent and that said Letters Patent is hereby corrected as shown below:

Col. 13, Claim 7, Line 55 "A process as claimed in claim 1 wherein the electrical resistivity the" should read --A process as claimed in claim 1 wherein the electrical resistivity of the--; and Col. 14, Claim 20, Line 61 "...wherein the electrical resistivity the..." should read --...wherein the electrical resistivity of the...--.

Signed and Sealed this
Seventeenth Day of April, 2012

David J. Kappos
*Director of the United States Patent and Trademark Office*